United States Patent
Wang

(10) Patent No.: US 8,226,426 B2
(45) Date of Patent: Jul. 24, 2012

(54) RADIO FREQUENCY CONNECTOR HAVING A PROBE

(75) Inventor: Xiao-Dong Wang, Shenzhen (CN)

(73) Assignees: Shenzhen Futaihong Precision Industry Co., Ltd., ShenZhen, Guangdong Province (CN); Chi Mei Communication Systems, Inc., Tu-Cheng, New Taipei (TW)

( * ) Notice: Subject to any disclaimer, the term of this patent is extended or adjusted under 35 U.S.C. 154(b) by 113 days.

(21) Appl. No.: 12/778,761

(22) Filed: May 12, 2010

(65) Prior Publication Data

US 2011/0189889 A1    Aug. 4, 2011

(30) Foreign Application Priority Data

Jan. 29, 2010    (CN) .......................... 2010 1 0300929

(51) Int. Cl.
*H01R 29/00* (2006.01)
*G01R 31/20* (2006.01)
(52) U.S. Cl. ................................... 439/188; 324/750.25
(58) Field of Classification Search .................... 439/63, 439/188, 578, 944; 324/750.25, 754.31
See application file for complete search history.

(56) References Cited

U.S. PATENT DOCUMENTS

| | | | | |
|---|---|---|---|---|
| 5,360,353 | A * | 11/1994 | Kinoshita | 439/620.09 |
| 6,554,630 | B2 * | 4/2003 | Uratani | 439/188 |
| 6,761,571 | B2 * | 7/2004 | Hida | 439/188 |
| 6,843,673 | B1 * | 1/2005 | Liu et al. | 439/188 |
| 6,881,082 | B2 * | 4/2005 | Jordan et al. | 439/188 |
| 7,098,680 | B2 * | 8/2006 | Fukushima et al. | 324/756.05 |
| 7,217,137 | B1 * | 5/2007 | Nakagawa | 439/63 |
| 7,458,837 | B2 * | 12/2008 | Mineo | 439/248 |
| 7,518,379 | B2 * | 4/2009 | Pukushima et al. | 324/630 |
| 7,791,360 | B2 * | 9/2010 | Fukushima et al. | 324/754.07 |
| 7,794,253 | B2 * | 9/2010 | Wang et al. | 439/188 |

* cited by examiner

*Primary Examiner* — Chandrika Prasad
(74) *Attorney, Agent, or Firm* — Altis Law Group, Inc.

(57) ABSTRACT

A portable electronic device includes a housing, a circuit board, an antenna, and a RF connector. The circuit board, the antenna, and the RF connector are within the housing. The antenna and the RF connector are electrically connected to the circuit board. The RF connector includes a probe and is capable of receiving test signals through the probe to test the portable electronic device, and the RF connector is also capable of connecting the antenna through the probe to receive communication signals to implement communication function of the portable electronic device. A RF connector used in the portable electronic device is also provided.

16 Claims, 5 Drawing Sheets

RADIO FREQUENCY CONNECTOR HAVING A PROBE

BACKGROUND

1. Technical Field

The disclosure generally relates to portable electronic devices, more particularly, to a radio frequency (RF) connector and a portable electronic device using the RF connector.

2. Description of the Related Art

RF chips are widely used in mobile phones, personal digital assistants (PDAs) and other portable electronic devices. When manufacturing portable electronic devices, it is necessary to test the RF chips for their ability to transmit RF signals. Thus, a RF test connector is provided on one circuit board of the portable electronic device, and it is connected to a corresponding test device (e.g., a signal analyzer) to process and test the RF signals.

However, in practical use, the RF test connector is idle and unnecessary when the portable electronic device is in a communication state. Moreover, the RF test connector is fixed on the circuit board, not only occupying extra space, but also adding to the cost of the unit.

Therefore, there is room for improvement within the art.

BRIEF DESCRIPTION OF THE DRAWINGS

Many aspects of a radio frequency connector and portable electronic device employing the same can be better understood with reference to the following drawings. The components in the drawings are not necessarily drawn to scale, the emphasis instead being placed upon clearly illustrating the principles of the exemplary radio frequency connector and portable electronic device employing the same. Moreover, in the drawings, like reference numerals designate corresponding parts throughout the several views. Wherever possible, the same reference numbers are used throughout the drawings to refer to the same or like elements of an embodiment.

DETAILED DESCRIPTION

Figure 1:
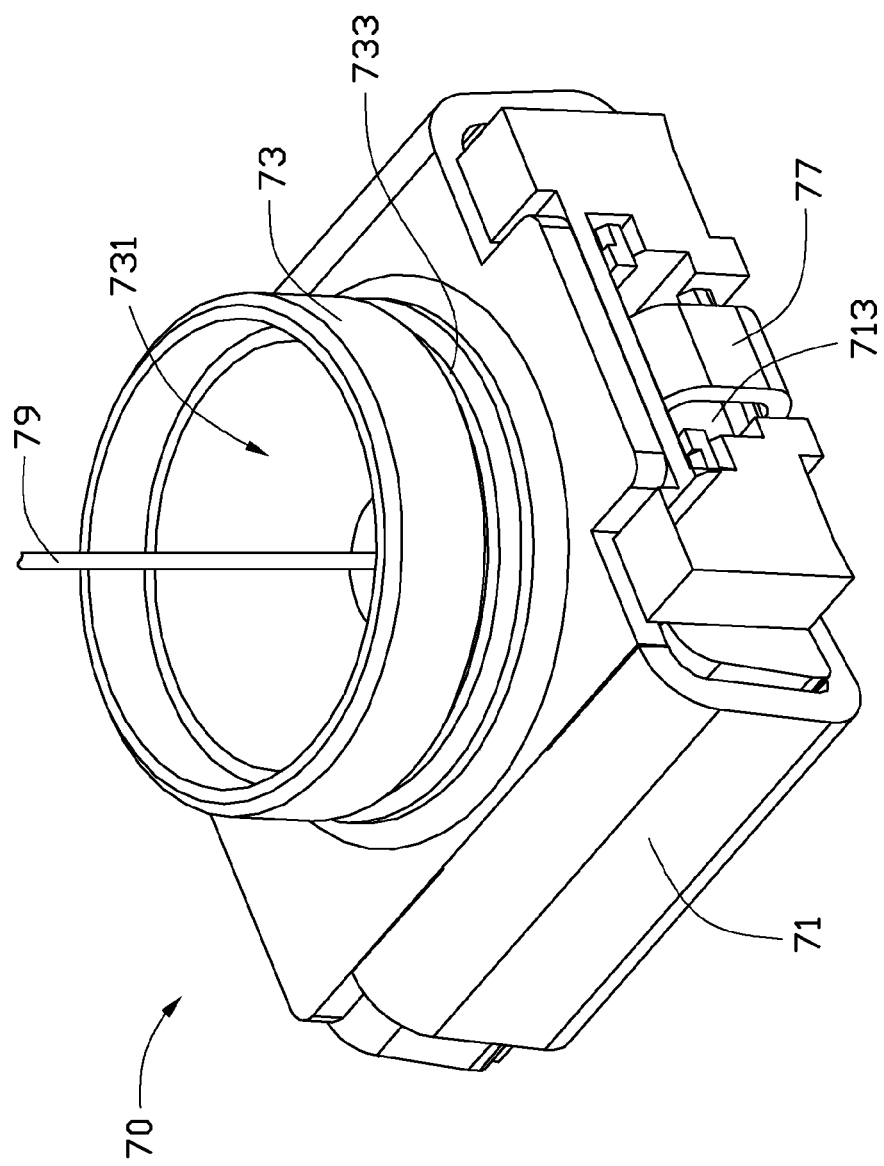
FIG. 1 is a schematic view of a RF connector of a portable electronic device, according to an exemplary embodiment.
Figure 2:
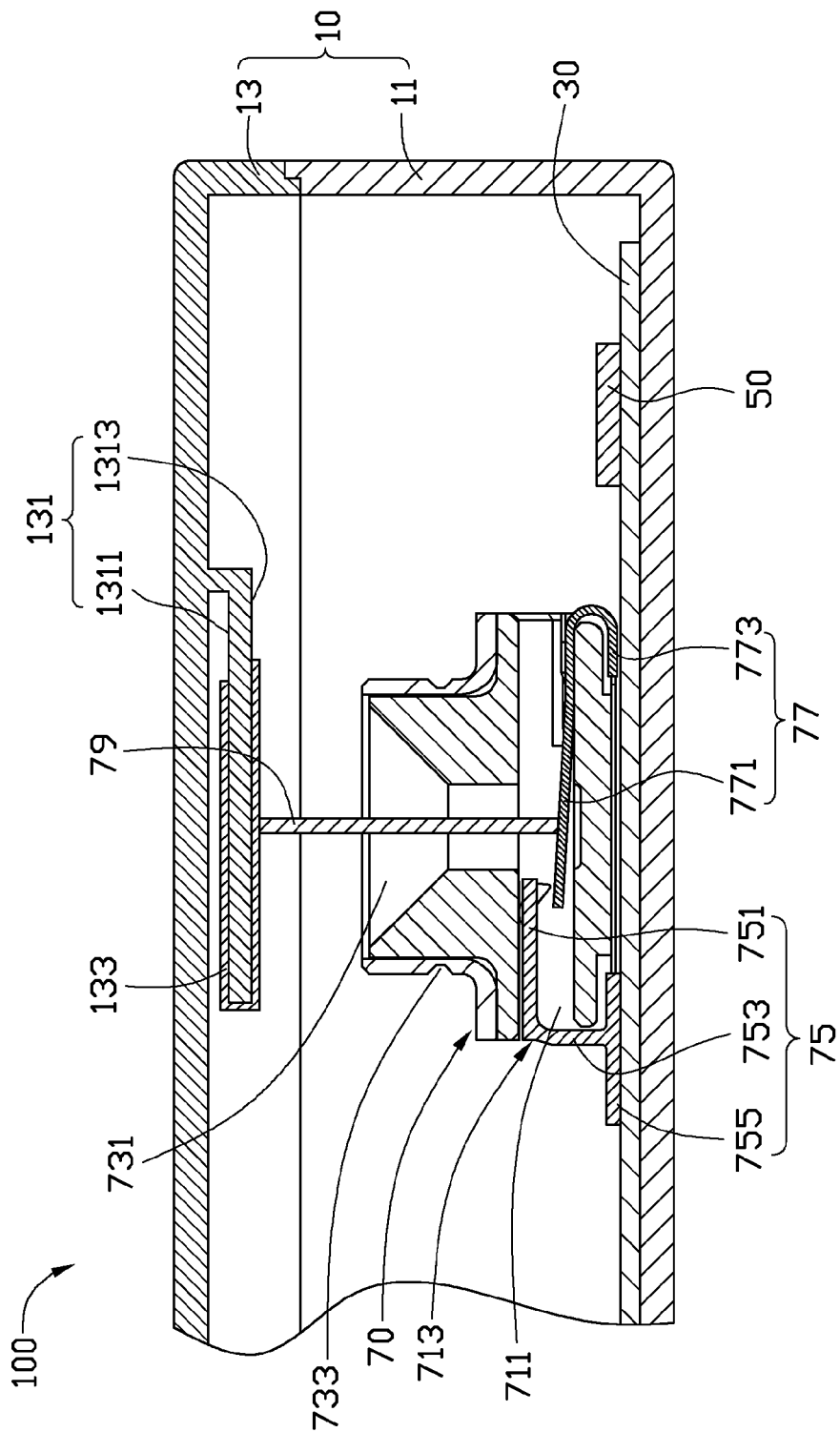
FIG. 2 is a cross-section of the portable electronic device in a communication state, according to the exemplary embodiment.

FIGS. 1 and 2 show an exemplary embodiment of a portable electronic device 100, such as a mobile phone, a PDA, or other device. The portable electronic device 100 includes a housing 10, a circuit board 30, a signal converting unit 50, and a RF connector 70. The circuit board 30 is within the housing 10. The signal converting unit 50 and the RF connector 70 are electrically installed on the circuit board 30. The RF connector 70 can be electrically connected to a test device (not shown), such as a conventional signal analyzer.

The housing 10 includes a first cover 11 and a second cover 13. The first cover 11 is capable of accommodating the circuit board 30 therein. The second cover 13 is covered on the first cover 11 for protecting various electronic components therein. The second cover 13 includes a holding section 131. An antenna 133 is fixed on the holding section 131 for transmitting and receiving RF signals.

The holding section 131 includes a first surface 1311 and an opposite second surface 1313 opposite to the first surface 1311. The first surface 1311 faces toward the second cover 13 and is substantially parallel to the circuit board 30 and the second cover 13. The antenna 133 may be an existing panel antenna and a substantially flat sheet. The holding section 131 is partially within the antenna 133. The antenna 133 can be electrically connected to the signal converting unit 50 through the RF connector 70 and the circuit board 30, which may be an existing flexible printed circuit (FPC) board for electrical connection of various electrical components thereon.

The signal converting unit 50 may be a RF chip and is electrically installed on the circuit board 30. The signal converting unit 50 is capable of converting a baseband signal into corresponding RF signal, and transmitting the RF signal to the antenna 133 after filtering, amplification and other processing. The signal converting unit 50 is also capable of converting the RF signal from the antenna 133 into corresponding baseband signal.

The RF connector 70 is installed on the circuit board 30 by using the surface mounted technology (SMT), and is capable of implementing RF test and normal communication of the portable electronic device 100. The RF connector 70 includes a main body 71, a connection section 73, a first elastic sheet 75, a second elastic sheet 77, and a probe 79. The connection section 73 is fixed on the main body 71, and the first elastic sheet 75 and the second elastic sheet 77 are within the main body 71.

The main body 71 is a housing that defines a receiving portion 711 and two openings 713 located at opposite sides of the main body 71. The receiving portion 711 communicates with the two openings 713. The connection section 73 is a cylindrical body and defines a through hole 731 connected to the receiving portion 711. The outer surface of the connection section 73 defines a plurality of threads 733.

The first elastic sheet 75 and the second elastic sheet 77 are made from elastic materials and are respectively installed at the corresponding openings 713. The first elastic sheet 75 includes a first portion 751, a second portion 753, and a third portion 755. The first portion 751, the second portion 753, and the third portion 755 are substantially flat sheets. Among them, the first portion 751 is substantially parallel to the third portion 755; the first portion 751 and the third portion 755 are vertically connected to the opposite sides of the second portion 753, respectively. One part of the third portion 755 is within the opening 713 and another part of the third portion 755 is exposed by the opening 713.

The second elastic sheet 77 is within the receiving portion 711 and includes a flexing section 771 and a fixing section 773 therein, both of which are substantially flat sheets. The distal end of the flexing section 771 resists against the first portion 751 of the first elastic sheet 75. Thus, when pressed, the flexing section 771 deforms and disconnects from the first portion 751. The probe 79 is fixed on the flexing section 771 through the through hole 731, such as by welding, and is partially exposed out from the through hole 731.

Further referring to FIG. 2, in assembly, the signal converting unit 50 is installed on the circuit board 30 and is electrically connected to the circuit board 30. The RF connector 70 is installed on the circuit board 30. The second cover 13 covers the first cover 11 and the through hole 731 is aligned with the holding section 131. Thus, the connection section 73 and the probe 79 face toward the second cover 13 and the probe 79 connects the antenna 133 within the holding section 131. The main body 71 is positioned on the circuit board 30 and the fixing section 773 is electrically connected to the circuit board 30. Thus, the RF signals from the signal converting unit 50 are transmitted to the test device or the antenna 133 through the circuit board 30, the second elastic sheet 77, and the probe 79.

Figure 3A:
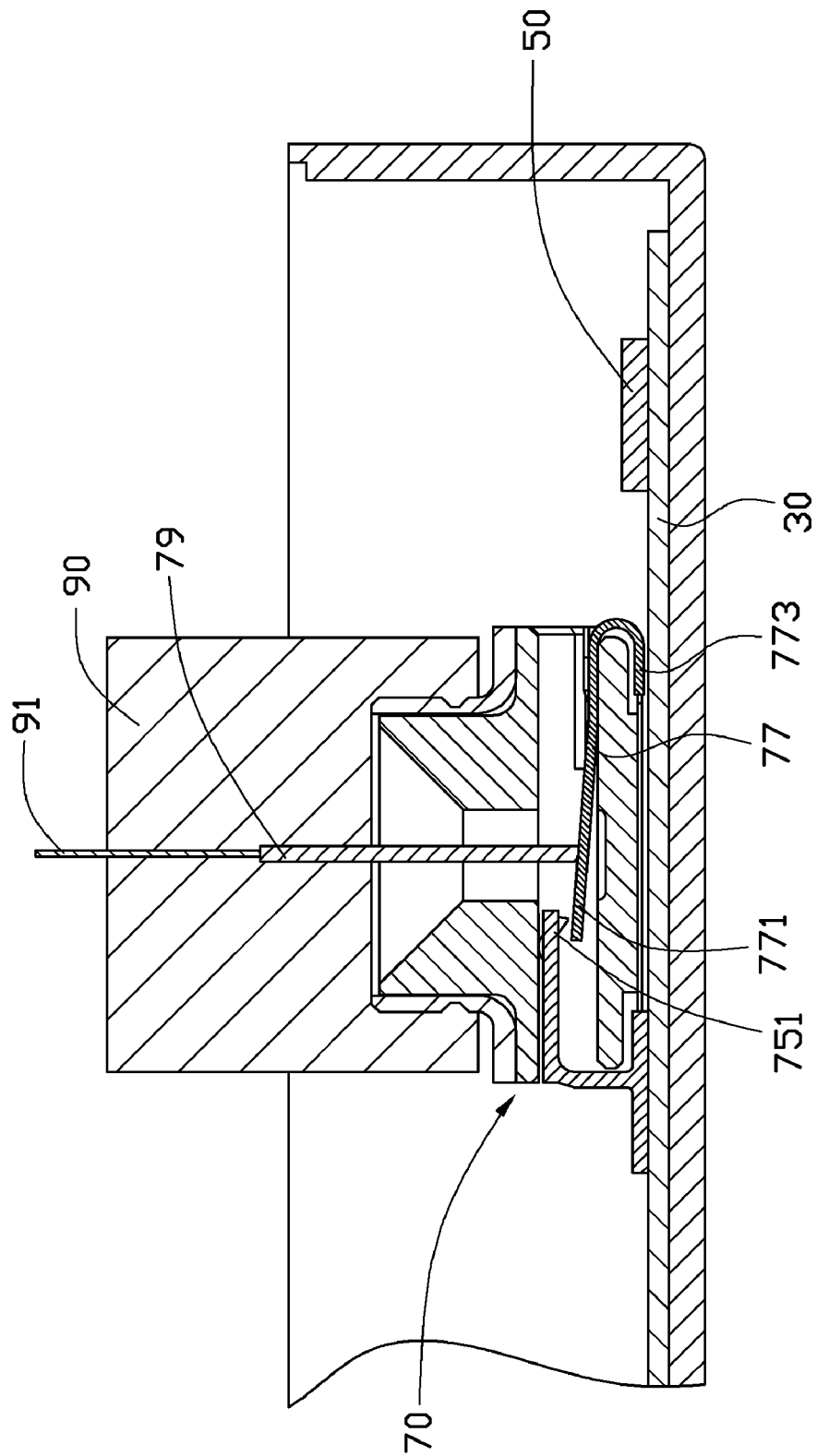
FIG. 3A is a cross-section of the portable electronic device in test state shown in FIG. 2.
Figure 3B:
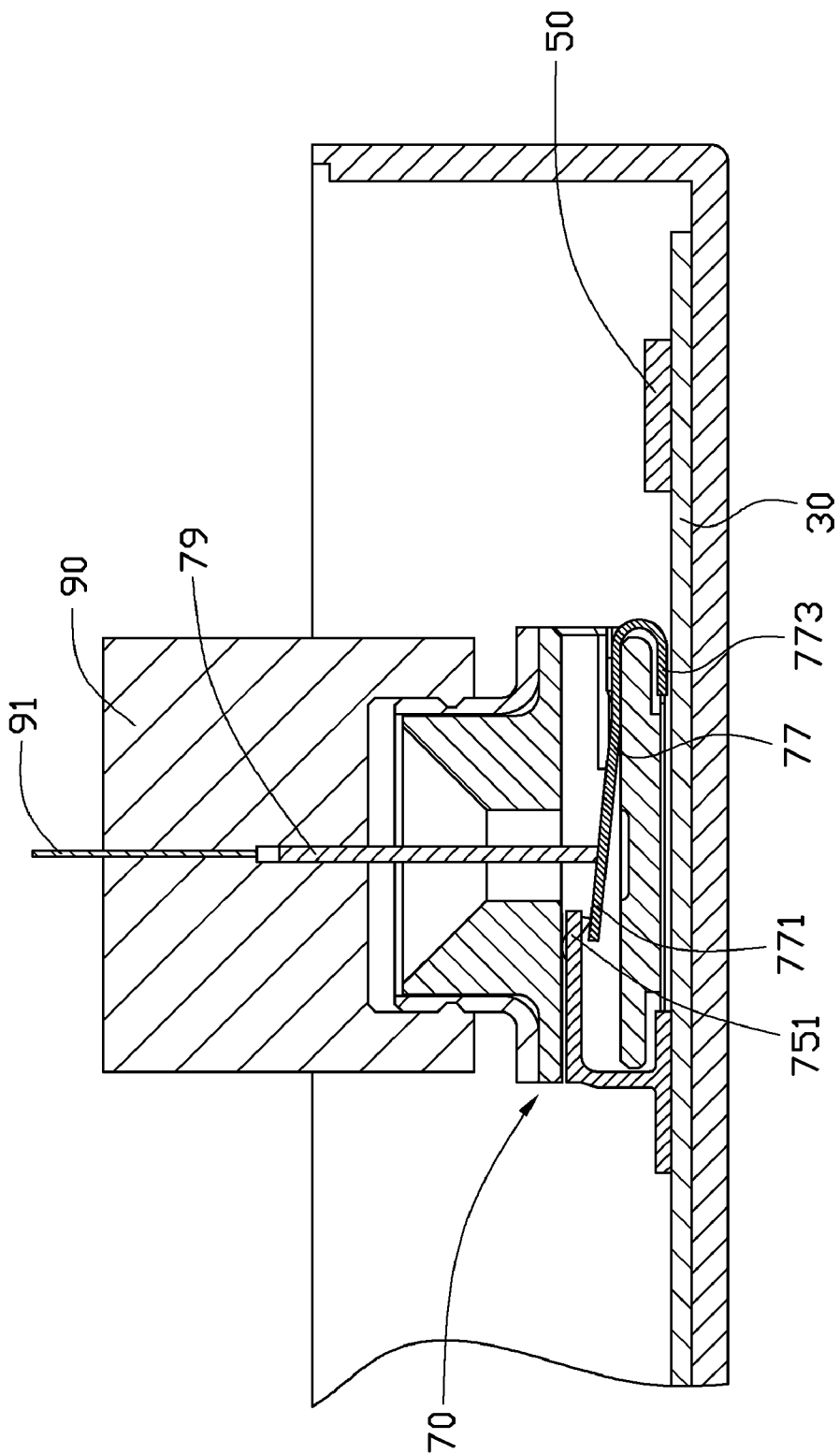
FIG. 3B is similar to FIG. 3a, but the connector is shown detached from the portable electronic device.

Further referring to FIG. 3, in test state, the second cover 13 is detached from the first cover 11 to expose the RF connector 70. A connector 90 (e.g., a sub-miniature-A connector) of the test device is installed on the connection section 73, and a contact end 91 of the connector 90 is electrically connected to the probe 79. Thus, the probe 79 resists and forces the flexing section 771 to move away from the first portion 751, resulting in disconnection of the first portion 751 from the flexing section 771. Thus, the RF signals from the signal converting unit 50 are transmitted to the test device through the circuit board 30, the fixing section 773, the flexing section 771, the probe 79, and the contact end 91.

Also referring to FIG. 2, in the communication state, the signal converting unit 50 converts the baseband signals into corresponding RF signals and processes the RF signals, for filtering and amplification, then the RF signals are transmitted to the antenna 133 through the circuit board 30, the fixing section 773, the flexing section 771, and the probe 79. Accordingly, the antenna 133 receives the RF signals and transmits the RF signals to the signal converting unit 50 through the probe 79, the flexing section 771, the fixing section 773, and circuit board 30. The signal converting unit 50 converts the RF signals into corresponding command signals to achieve various functions of the portable electronic device 100.

Figure 4:
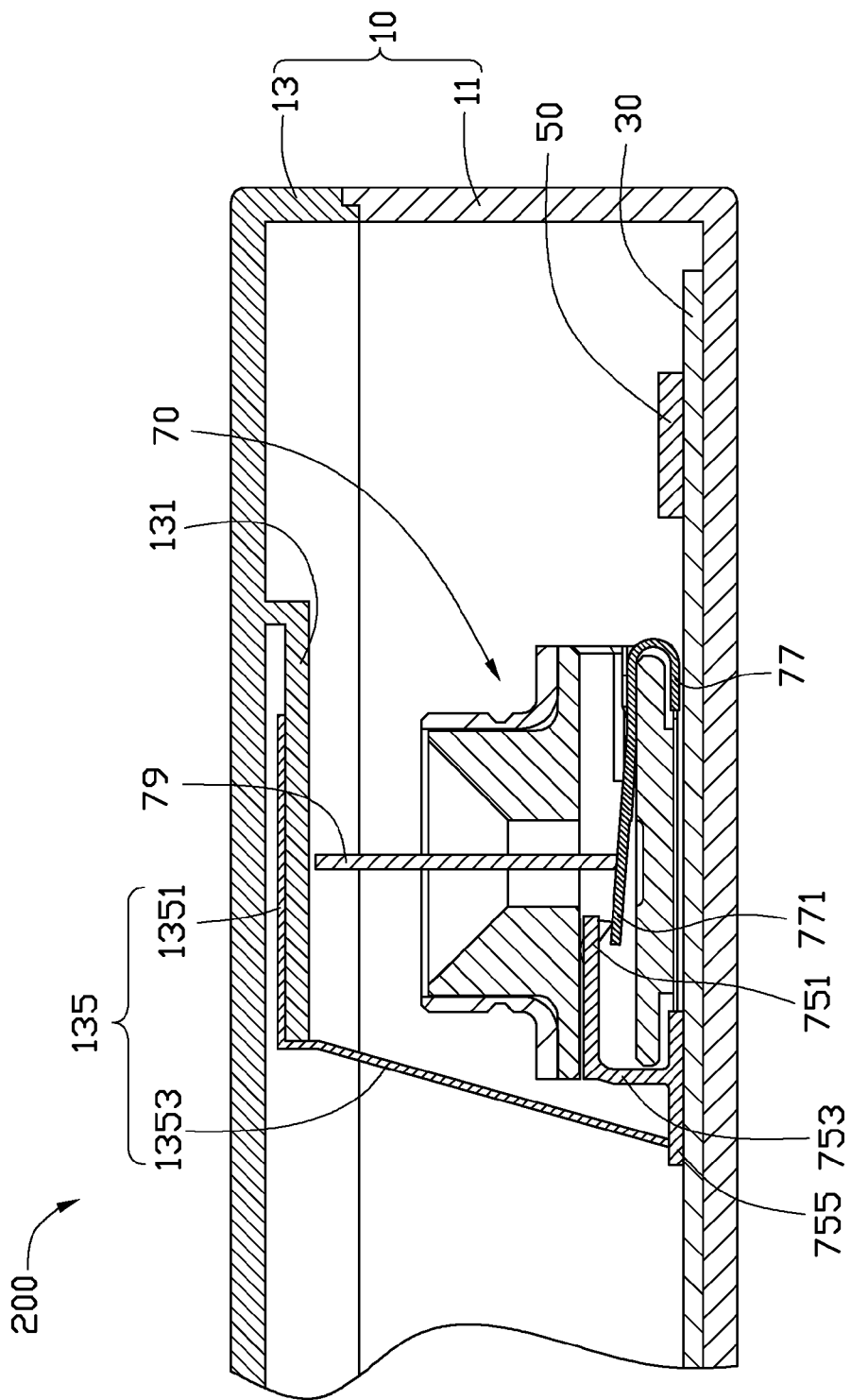
FIG. 4 is a cross-section of a portable electronic device in a communication state, according to another embodiment.

FIG. 4 shows another exemplary embodiment of a portable electronic device 200. The portable electronic device 200 also includes a housing 10, a circuit board 30, a signal converting unit 50, and a RF connector 70, which are the same as the portable electronic device 100. In this embodiment, the probe 79 is disconnected from the holding section 131 of the housing 10, and the flexing section 771 elastically contacts the first portion 751. An antenna 135 is installed on the holding section 131 thereon and includes a base member 1351 and a connection member 1353. One end of the connection member 1353 is connected to the base member 1351, another end of the connection member 1353 is connected to the third portion 755 of the first elastic sheet 75.

Also referring to FIG. 4, the portable electronic device 200 uses the RF connector 70 to implement RF test, which is same with the first exemplary embodiment of the portable electronic device 100. When the portable electronic device 200 is in the communication state, accordingly, the RF signals from the signal converting unit 50 are transmitted to the antenna 135 through the circuit board 30, the second elastic sheet 77, the first portion 751, the second portion 753, and the third portion 755. Accordingly, the RF signals from the antenna 135 are transmitted to the signal converting unit 50 through the connection member 1353, the first elastic sheet 75, the second elastic sheet 77, and the circuit board 30.

In the RF connector 70 and the portable electronic device employing the RF connector 70 of the exemplary embodiment, the probe 79 is installed in the RF connector 70 to implement RF test and communication test, thus, the probe 79 and the RF connector 70 are integrated together and assembled in the portable electronic device. Thus, the RF connector 70 can implement the RF test as well as normal communication function, so that it is now a more useful component on the circuit board 30 and not only there for testing, which is not only space saving, but also reduces costs.

It is to be understood, however, that even though numerous characteristics and advantages of the exemplary disclosure have been set forth in the foregoing description, together with details of the structure and function of the exemplary disclosure, the disclosure is illustrative only, and changes may be made in detail, especially in matters of shape, size, and arrangement of parts within the principles of exemplary disclosure to the full extent indicated by the broad general meaning of the terms in which the appended claims are expressed.

What is claimed is:

1. A radio frequency (RF) connector, comprising:
   a main body;
   a first elastic sheet being electrically conductive within the main body, the first elastic sheet comprising a first portion;
   a second elastic sheet being electrically conductive within the main body, the second elastic sheet capable of elastic deformation and comprising a flexing section elastically contacting the first portion to enable the second elastic sheet to transfer signals to the first elastic sheet; and
   a probe installed on the second elastic sheet and exposed out from the main body, wherein the second elastic sheet transfers test signals or communication signals through the first elastic sheet or the probe.

2. The RF connector as claimed in claim 1, wherein the main body comprises a receiving portion and two openings located at opposite sides of the main body, and the receiving portion communicates with the two openings.

3. The RF connector as claimed in claim 2, further comprising a connection section installed on the main body, wherein the connection section defines a through hole connected to the receiving portion, and the probe passes through and exposed out from the through hole.

4. The RF connector as claimed in claim 2, wherein the first elastic sheet and the second elastic sheet are made from elastic materials and are respectively installed at the openings.

5. The RF connector as claimed in claim 4, wherein the first elastic sheet comprises a second portion, and a third portion, the first portion is parallel to the third portion, the first portion and the third portion are respectively connected to the opposite sides of the second portion, one part of the third portion is within the opening, and another part of the third portion is exposed by the opening.

6. The RF connector as claimed in claim 5, wherein the second elastic sheet comprises a fixing section connected to one end of the flexing section, another end of the flexing section resists and connects with the first elastic sheet, and the fixing section is electrically connected to the circuit board.

7. A portable electronic device, comprising:
   a housing;
   a circuit board within the housing;
   an antenna installed at the housing and connected to the circuit board; and
   a radio frequency (RF) connector positioned on the circuit board and electrically connected to the circuit board, the RF connector comprising a probe, wherein the RF connector is capable of receiving test signals through the probe to test the portable electronic device, and the RF connector is capable of connecting the antenna to the circuit board through the probe to receive communication signals to implement communication function of the portable electronic device.

8. The portable electronic device as claimed in claim 7, further comprising a signal converting unit electrically connected to the circuit board, wherein the signal converting unit is a RF chip and capable of signal conversion.

9. The portable electronic device as claimed in claim 8, wherein the RF connector comprises a first elastic sheet and a second elastic sheet, the first elastic sheet and the second elastic sheet are made from elastic materials and are electrically conductive, and the second elastic sheet is electrically connected to the circuit board, the second elastic sheet is connected to the first elastic sheet to transmit test signals or communication signals.

10. The portable electronic device as claimed in claim 9, wherein the probe is installed on the second elastic sheet and is exposed out from the RF connector, when the second elastic sheet is disconnected from the first elastic sheet, the test signal are transmitted from the signal converting unit to a test device through the circuit board, the second elastic sheet, and the probe for RF test.

11. The portable electronic device as claimed in claim 10, wherein the RF connector further comprises a main body, the main body comprises a receiving portion and two openings located at opposite sides of the main body, the receiving portion communicates with the two openings, and the first elastic sheet and the second elastic sheet are respectively installed at the openings.

12. The portable electronic device as claimed in claim 11, wherein the RF connector further comprises a connection section installed on the main body, the connection section defines a through hole connected to the receiving portion, and the probe is exposed out from the through hole and transmits the test signals from the signal converting unit to the test device or transmits the communication signals from the antenna to the signal converting unit.

13. The portable electronic device as claimed in claim 11, wherein the first elastic sheet comprises a first portion, a second portion, and a third portion, the first portion is parallel to the third portion, the first portion and the third portion are respectively connected to the opposite sides of the second portion, one part of the third portion is within the opening, and another part of the third portion is exposed by the opening, and the third port connects the antenna to the circuit board or the probe and the second elastic sheet connect the antenna to the circuit board.

14. The portable electronic device as claimed in claim 13, wherein the second elastic sheet comprises a flexing section and a fixing section connected to one end of the flexing section, another end of the flexing section resists and connects with the first elastic sheet and the probe is installed on the flexing section, and the fixing section is electrically connected to the circuit board.

15. The portable electronic device as claimed in claim 12, wherein the housing comprises a first cover and a second cover assembled on the first cover, the first cover comprises a holding section, the holding section is aligned with the through hole, the antenna is within the holding section and is connected to the probe to transmit the communication signals.

16. The portable electronic device as claimed in claim 12, wherein the housing comprises a first cover and a second cover assembled on the first cover, the first cover comprises a holding section, the holding section is aligned with the through hole, the antenna includes a base member and a connection member, one end of the connection member is connected to the base member, another end of the connection member is connected to the first elastic sheet, and the communication signals are transmitted from the antenna to the signal converting unit through the first elastic sheet, the second elastic sheet, and the circuit board, or the communication signals are transmitted from the signal converting unit to the antenna through the circuit board, the second elastic sheet, and the first elastic sheet.

* * * * *